US012021060B2

(12) United States Patent
Du et al.

(10) Patent No.: US 12,021,060 B2
(45) Date of Patent: Jun. 25, 2024

(54) REDUCING KEEP-OUT-ZONE AREA FOR A SEMICONDUCTOR DEVICE

(71) Applicant: Western Digital Technologies, Inc., San Jose, CA (US)

(72) Inventors: Kevin Du, Shanghai (CN); Hope Chiu, Shanghai (CN); Zengyu Zhou, Shanghai (CN); Alex Zhang, Shanghai (CN); Vincent Jiang, Shanghai (CN); Shixing Zhu, Shanghai (CN); Paul Qu, Shanghai (CN); Yi Su, Shanghai (CN); Rui Yuan, Shanghai (CN)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 17/028,484

(22) Filed: Sep. 22, 2020

(65) Prior Publication Data

US 2022/0093559 A1 Mar. 24, 2022

(51) Int. Cl.
*H01L 21/56* (2006.01)
*H01L 21/48* (2006.01)
*H01L 23/00* (2006.01)
*H01L 23/31* (2006.01)
*H01L 25/00* (2006.01)
*H01L 25/065* (2023.01)

(52) U.S. Cl.
CPC ...... *H01L 25/0652* (2013.01); *H01L 21/4853* (2013.01); *H01L 21/563* (2013.01); *H01L 23/3185* (2013.01); *H01L 24/16* (2013.01); *H01L 25/50* (2013.01); *H01L 2224/16225* (2013.01); *H01L 2225/06506* (2013.01); *H01L 2225/06517* (2013.01); *H01L 2225/06562* (2013.01); *H01L 2225/06582* (2013.01); *H01L 2924/14511* (2013.01); *H01L 2924/18161* (2013.01); *H01L 2924/19105* (2013.01)

(58) Field of Classification Search
CPC ....... H01L 25/065–0657; H01L 21/563; H01L 2224/26175; H01L 2924/18161; H01L 2224/83051; H01L 2224/27013; H01L 21/56; H01L 2224/02245; H01L 2224/02255; H01L 2224/26145
See application file for complete search history.

(56) References Cited

U.S. PATENT DOCUMENTS

| | | | |
|---|---|---|---|
| 9,728,425 B1 * | 8/2017 | Heppner | ........... H01L 21/67126 |
| 10,373,888 B2 | 8/2019 | Li et al. | |
| 10,529,637 B1 * | 1/2020 | Yu | ............... H01L 25/50 |
| 10,741,419 B2 * | 8/2020 | Karhade | ................. H01L 24/97 |
| 11,158,558 B2 * | 10/2021 | Jain | ..................... H01L 25/0657 |

(Continued)

FOREIGN PATENT DOCUMENTS

| | | | | |
|---|---|---|---|---|
| WO | WO-2013101668 A1 * | 7/2013 | ............. | H01L 23/24 |
| WO | 2019-005110 A1 | 1/2019 | | |

*Primary Examiner* — Nicholas J Tobergte
*Assistant Examiner* — William Henry Anderson
(74) *Attorney, Agent, or Firm* — Morgan, Lewis & Bockius LLP

(57) ABSTRACT

A packaged semiconductor includes a substrate and a first component disposed on the substrate. The package includes an underfill that is dispensed under and around the first component. The package also includes a second component disposed on the substrate adjacent to the first component that provides a border to the underfill.

18 Claims, 6 Drawing Sheets

(56) References Cited

U.S. PATENT DOCUMENTS

| | | | |
|---|---|---|---|
| 2010/0140811 A1* | 6/2010 | Leal | H01L 24/24 |
| | | | 257/777 |
| 2010/0176509 A1* | 7/2010 | Murai | H01L 24/12 |
| | | | 257/737 |
| 2017/0178988 A1* | 6/2017 | Cheney | H01L 21/4853 |
| 2018/0294251 A1* | 10/2018 | Liu | H01L 25/0657 |
| 2020/0143870 A1* | 5/2020 | Zhao | G11C 11/4096 |
| 2020/0402877 A1* | 12/2020 | Yu | H01L 23/147 |
| 2021/0200699 A1* | 7/2021 | Keeth | H01L 25/0657 |

\* cited by examiner

REDUCING KEEP-OUT-ZONE AREA FOR A SEMICONDUCTOR DEVICE

BACKGROUND

This disclosure relates generally to electrical device packaging technologies, and more particularly, to reducing a keep-out-zone (KOZ) area for packaged semiconductors.

Generally, a hybrid flip chip (HFC) package is assembled by one or more components and can include one or more KOZ areas. A component is any electrical, mechanical, or electro-mechanical device. A KOZ area is a "keep-out section" that is free of components and/or printed circuit board (PCB) traces and that is maintained under all application and environmental conditions. For instance, a HFC product is conventionally assembled by attaching a flip chip (FC) die to a substrate, dispensing an underfill (UF) on the substrate, attaching spacers and/or other dies to the substrate, electrically connecting the dies to the substrate and/or each other, and covering the assembly with a mold compound.

In conventional manufacturing/assembling, dispensing the UF can occur before the mold process. However, as item placements of the HFC product change to accommodate next generation components (which can be sized and shaped differently), there is a risk that these next generation components cannot be filled properly by the mold compound during the mold process. For example, if a next generation NAND die has a bigger die size, an embedded structure may be used where a component capacitance and resistance are placed below the NAND die. This configuration raises issues with how to apply the UF to not produce solder bridge issues (e.g., two or more pads become connected through an excessive application of solder). As another example, during the dispensing of the UF, the KOZ area (e.g., especially at UF dispensing side) of the substrate takes a large amount of space, which prevents an economic use of a surface area of the substrate. In turn, there is less space available for die stacking.

Due to a desire for smaller and more compact HFC products, elimination of solder bridge issues within HFC products, and a reduction in cost for assembling HFC products, a need exists to provide improved manufacturing techniques thereof.

SUMMARY

Various embodiments of a package are disclosed. Broadly speaking, a package is provided that includes a substrate and a first component. The first component is disposed on the substrate. The package includes an underfill that is dispensed under and around the first component. The package also includes a second component that is disposed on the substrate and provides a border to the underfill.

According to one or more embodiments, the package can be implemented as a method, an apparatus, and/or a system.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION OF EMBODIMENTS

Disclosed herein are methods and semiconductor device packages. More particularly, this disclosure relates to reducing a KOZ area for a semiconductor package by increasing a die stacking area and eliminating solder bridge concerns.

For example, according to one or more embodiments, the package can be a System in a Package (SIP), a HFC package, a three dimensional package, or the like, including one or more components attached to a substrate. The package includes a substrate and a first component (e.g., FC die). The first component is on the substrate. The package includes an underfill that is dispensed under and around the first component. The package also includes a second component (e.g., a bottom NAND die of a NAND die stack, a dam, a spacer, etc.) that is on the substrate and provides a border to the underfill. For example, the bottom NAND die can be attached before the FC die is attached and before UF dispensing, with other NAND dies being stacked on the bottom NAND die after dispensing the underfill. In this way, the bottom NAND die is used as a dam on a dispensing side of the first component to keep the UF to a desired size or within a certain area (e.g., a very small area relative to conventional manufacturing/assembling described herein), which effectively decreases a UF KOZ area and leaves more space, which can be used to stack lager NAND dies (e.g., next generation NAND dies). As another example, one or more components (e.g., a bottom NAND die of a NAND die stack, a spacer, etc.) can be placed on a side opposite a dispensing side of the FC die and a solder mark (SR) dam can be placed on the dispensing side, such that the SR dam is used to keep the UF to the desired size.

The technical effects and benefits of the package include an ability to accommodate larger components yet remain within the current package size and/or to reduce the substrate size and overall package size because components may be located closer to the HFC die (e.g., a smaller KOZ area equates to more room for components). That is, the package dramatically decreases the KOZ area with respect to conventional manufacturing/assembling by suppressing a flow of the UF.

Figure 1:
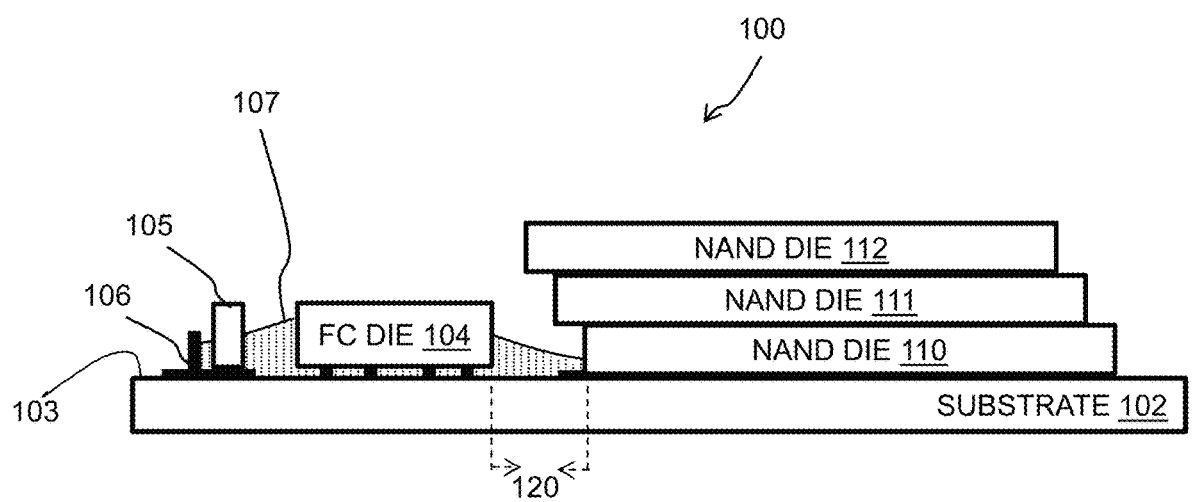
FIG. 1 is a diagram depicting a package according to one or more embodiments.

FIG. 1 is a diagram depicting a package 100 (e.g., shown as a cross section of a package structure) according to one or more embodiments. The package 100 includes a substrate 102 having a first major surface 103, a first component such as a FC die 104 attached to the first major surface 103, a device 105 attached to the first major surface 103, a dam 106, and an UF 107 dispensed under and around the FC die 104. The substrate 102 is a material that provides a surface (e.g., the first major surface 103) on which components are deposed, attached, deposited, or inscribed. Examples of the substrate 102 include, but are not limited to, an organic substrate used to manufacture integrated circuits. The FC die 104 is an integrated circuit that can be attached to and electrically connected to contacts on the surface of the substrate using bumps or balls. The device 105 can be a component such as any electrical, mechanical, or electro-mechanical device as described herein. In some embodiments, the device 105 comprises a passive device such as a resistor or a capacitor. The dam 106 is a barrier to prevent or stop a flow of the UF 107. The dam 106 may be formed in various ways, such as with epoxy. In one embodiment, the dam 106 comprises a solder mark dam. The UF 107 is a material (e.g., a composite made up of an epoxy polymer) with initially liquid properties that flows around and under one or more components (i.e., the FC die 104) of the package 100 to provide stability and prevent conductivity once solidified.

Further, the package 100 includes a NAND die stack formed on the first major surface 103 of the substrate 102 adjacent to the FC die 103. The NAND die stack is made up of a bottom NAND die 110 and at least one additional NAND die (e.g., represented by NAND dies 111 and 112). As shown in FIG. 1, the UF 107 flows between the dam 106 and the bottom NAND die 110. The NAND dies 110, 111, and 112 are a type of nonvolatile storage technology (e.g., flash memory) that does not require power to retain data. Thus, the package 100 shown in FIG. 1 comprises a solid state memory device (SSD).

According to an embodiment, a second component of the package 100 can be considered the dam 106 or the bottom NAND die 110, while a third component can be considered the remaining one of the dam 106 and the bottom NAND die 110, configured on the substrate to provide a border to the underfill and define a KOZ area. In some cases, the second or third component of the package 100 can be a spacer. The package 100 differs from conventional packages in that the KOZ area is at least partially defined by the bottom NAND die 110.

Figure 2:
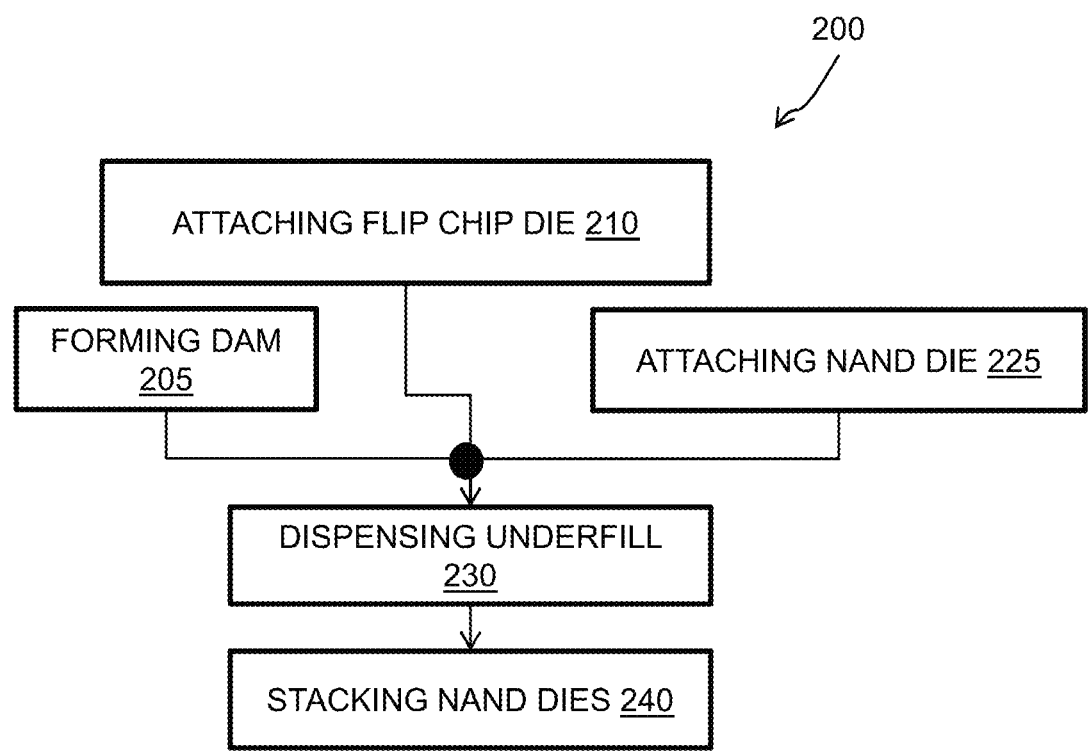
FIG. 2 is a diagram of a process flow depicting a manufacturing method according to one or more embodiments.

FIG. 2 is a diagram of a process flow 200 depicting a method of assembling a semiconductor device package, such as the package 100, according to one or more embodiments. For ease of understanding, the process flow 200 may be described herein with respect to FIG. 1, although it will be understood that the other packages may be assembled using the steps described herein. The process flow 200, generally, describes providing borders to the UF 107 and controlling a flow of the UF 107 within a larger package assembly process (e.g., building of the package 100).

The process flow 200 begins at block 205, where the dam 106 is formed on the first major surface 103 of the substrate 102. At block 210, the FC die 104 is attached to the substrate 102 and as discussed herein, is electrically connected to contacts on the surface 103. At block 225, the bottom NAND die 110 is attached to the substrate 102. In contrast to the FC die 104, the NAND dies are electrically connected with contacts on the substrate with bond wires (not shown in FIG. 1). Note that these elements can be attached in any order. Further, either the dam 106 or the bottom NAND die 110 can be referred to as a second component.

At block 230, the UF 107 is dispensed to flow under and around the FC die 104. In this regard, the UF 107 flows between the dam 106 and the bottom NAND die 110, both of which stop or prevent the UF 107 from extending beyond a desired point. Thus, the dam 106 acts as a border on one side of the FC die 104, and the bottom NAND die 110 acts as another border on the other side of the FC die 104. A technical effect and advantage thereof is that the UF 107 can be dispensed on either side of the FC die 104. Another advantage is that by attaching the bottom NAND die 110 to the substrate 102 before dispensing the UF 107, a KOZ area size is reduced because the NAND die 110 itself prevents the UF 107 from spreading further out over the surface 103 of the substrate 102.

At block 240, at least one additional NAND die is stacked on the bottom NAND die 110. Note that a KOZ area 120 of the package 100 is sized respective to the configuration of the dam 106 and the bottom NAND die 110. After dispensing the UF 107 at block 240, additional processes such as wire bonding and molding may be performed.

Figure 3A:
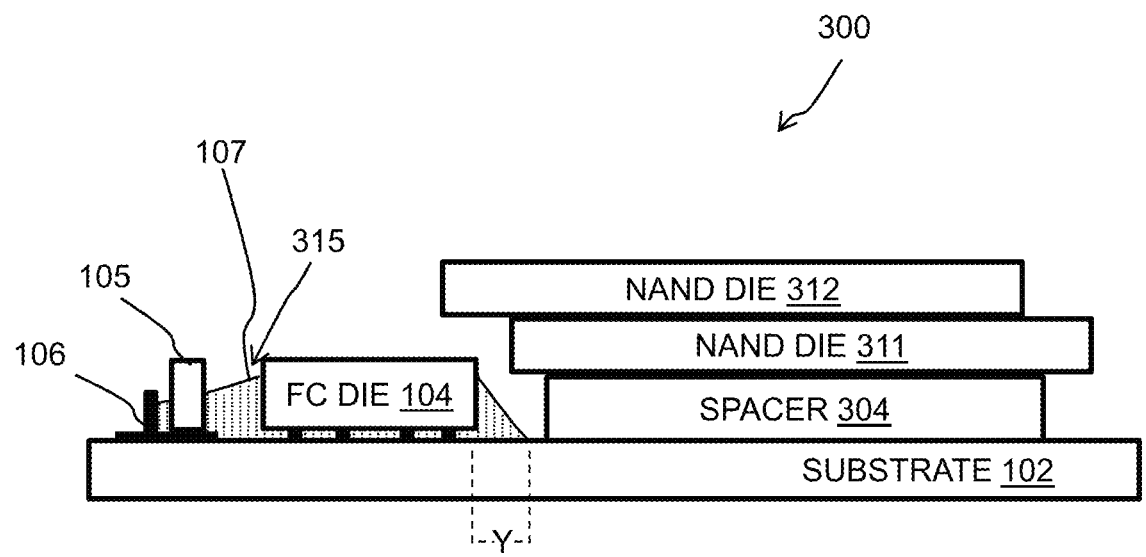
FIG. 3A illustrates a partially assembled package according to one or more embodiments.
Figure 3B:
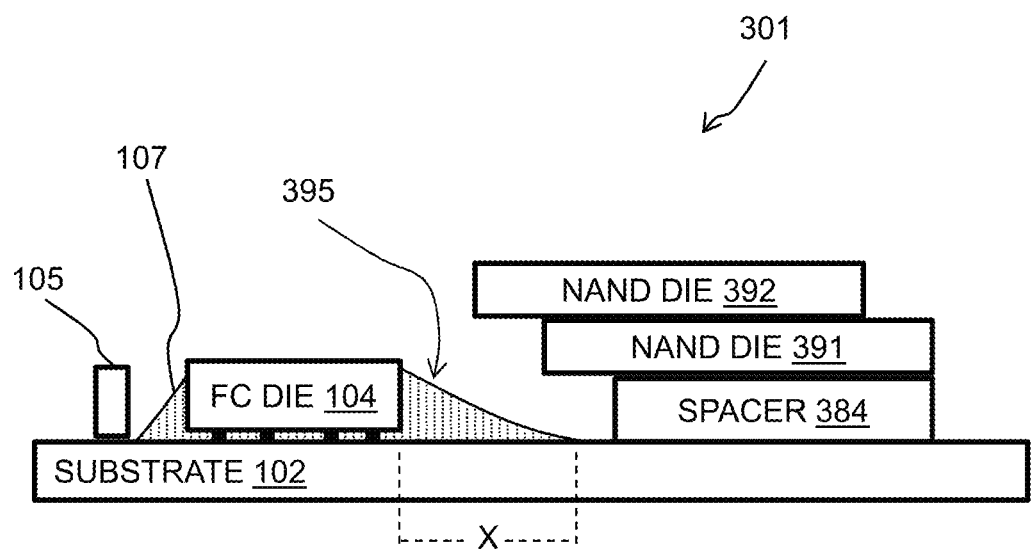
FIG. 3B illustrates a partially assembled package according to one or more embodiments.

FIG. 3A illustrates a package 300 (shown as a cross section of a package structure) according to one or more embodiments that depicts technical improvements over another package 301 shown in FIG. 3B. Items of the packages 300 and 301 that are similar to those of package 100 use the same element numbers and are not redefined for brevity.

The package 300 comprises the substrate 102, a first component shown as the FC die 104), a spacer 304, a device 105, a dam 106, and an UF 107 dispensed under and around the FC die 104. The spacer 304 is a non-conducting item that enables precise placement of other components (e.g., the NAND die stack) within the package 300. In one embodiment, the spacer 304 comprises a blank silicon die. Further, the package 300 includes a NAND die stack represented by NAND dies 311 and 312, which are stacked on the spacer 304. As shown in FIG. 3, the UF 107 flows from a dispensing side 315 of the FC die 104 to/toward the spacer 304, and also spreads to the dam 106 (e.g., a border of the UF 307).

In contrast, the package 301 includes the substrate 102, the FC die 104, a spacer 384, the device 105, the UF 107, and NAND dies 391 and 392, which are stacked on the spacer 384. The UF 107 flows from a dispensing side 395 of the FC die 104 to/toward the device 105, and also spreads to the spacer 384. The technical effect and benefit of the package 300 includes a KOZ area of a size Y, which is smaller than a size X of the KOZ area of the package 301. This is because the dispensing side is moved to an opposite side of FC die 104 in package 300, such that a spreading flow of the UF 107 is controlled/stopped by the dam 106 (e.g., note that, in general, a UF dispensing side needs a large space as an existing "spreading force" drives the UF to flow on the surface 103 of the substrate 102; since the spreading force and corresponding flow are the main reasons for a large KOZ area, using the dam 106 enables more precise control of the spreading force and corresponding flow and permits a reduced KOZ area). In turn, the spacer 304 (or any component that can replace the spacer 304) can be placed closer to the FC Die 104. Note also that the spacer 304 and the NAND dies 311 and 312 can consume a relatively larger space on the substrate 102 than the spacer 384 and the NAND dies 391 and 392 (i.e., the NAND dies 391 and 392 have a relatively smaller size when compared to the NAND dies 311 and 312). Additionally, the technical effect and benefit of the package 300 includes a smaller filler size (e.g., compared to mold compound) for the UF 107 to fully fill a bottom region of device 105 and to eliminate any solder bridge issues with respect to the device 105.

Figure 4:
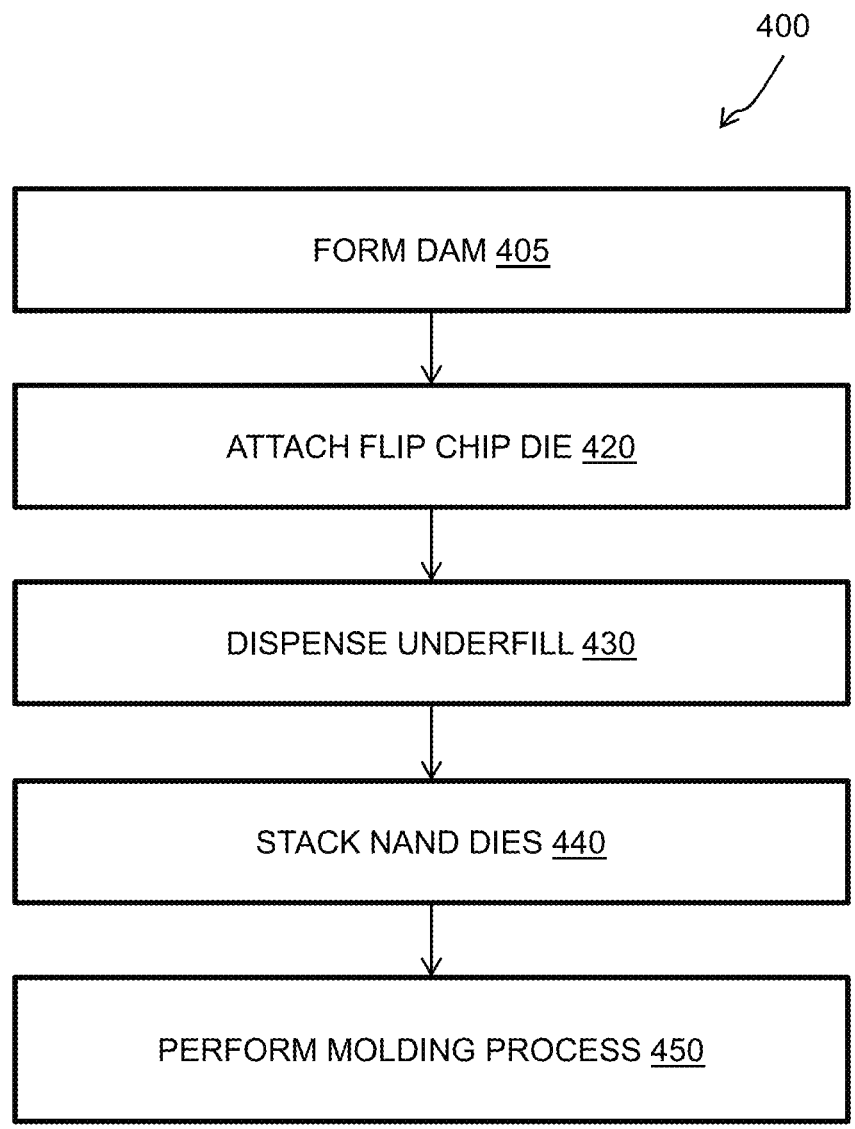
FIG. 4 is a diagram of a process flow depicting a manufacturing method according to one or more embodiments.

FIG. 4 is a diagram of a process flow 400 depicting a manufacturing method according to one or more embodiments. For ease of understanding, the process flow 400 may be described herein with respect to FIG. 3A. The process flow 400, generally, describes controlling a flow of the UF 107 within a larger package assembly process (e.g., building of the package 300).

The process flow 400 begins at block 405, where the dam 106 is formed on the substrate 102. The dam 106 may be formed using an organic substrate process. At block 420, the FC die 104 is attached to the substrate 102. Note that the device 105 can also be attached at this time. Also, note that these elements can be attached in any order. Further, the dam 306 may be referred to as a second component.

At block 430, the UF 107 is dispensed to flow under and around the FC die 104. In this regard, the UF 307 flows from the dispensing side 315 to flow under and around of the FC die 104 and also spread to the dam 106, which stops or prevents the UF 307 from extending beyond the substrate 102. Thus, a side of the dam 106 acts as a border on one side of the FC die 104.

At block 440, the spacer 384 and the NAND die stack are formed (the NAND dies are attached to each other and the substrate 102). At block 450, a molding process is performed to cover or encapsulate the components attached to the surface of the substrate 102. Note that a size Y of the KOZ area of the package 300 is smaller than a size X of a KOZ area of the package 301.

Figure 5:
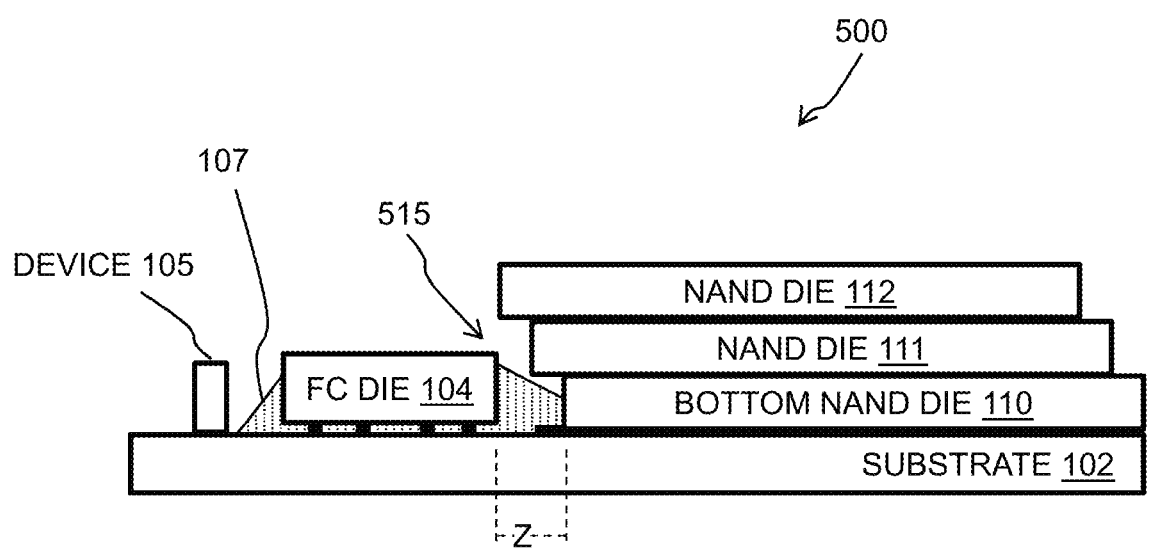
FIG. 5 illustrates partially assembled package according to one or more embodiments.

FIG. 5 illustrates a package 500 (e.g., shown as a cross section of a package structure) according to one or more embodiments. Items of the packages 500 that are similar to those of packages 100, 300, and 301 use the same element numbers and are not redefined for brevity.

The package 500 includes the substrate 102, a first component (i.e., FC die 104), a device 105, and an UF 107 dispensed under and around the FC die 104. Further, the package 500 includes a NAND die stack made up of a bottom NAND die 110 and at least one additional NAND die, but here represented by NAND dies 111 and 112). As shown in FIG. 5, the UF 107 flows from a dispensing side 515 to flow under and around of the FC die 104 and spread to the bottom NAND die 110, which acts as a border of the UF 107.

In contrast to the package 301 of FIG. 3B, where the UF 107 flows from the dispensing side 395 to flow under and around the FC die 104 and spread in the region between FC die 104 and the spacer 384, such that the KOZ area has a size X, in the package 500, the UF 107 flows to and abuts the bottom NAND die 110 so the KOZ area has a size Z that is much smaller than the size X of FIG. 3B. Thus, the technical effect and benefit of the package 500 includes the KOZ area of the size Z, which is smaller than the size X of the KOZ area of the package 301. This is because a spreading flow of the UF 107 is controlled/stopped by the bottom NAND die 510. In turn, the bottom NAND die 510 (or any component that replaces the bottom NAND die 510) can be placed closer to the FC Die 104. Note also that the NAND die stack of the package 500 can consume a relatively larger space on the substrate 102 than the spacer 384 and the NAND dies 311 and 312.

Figure 6:
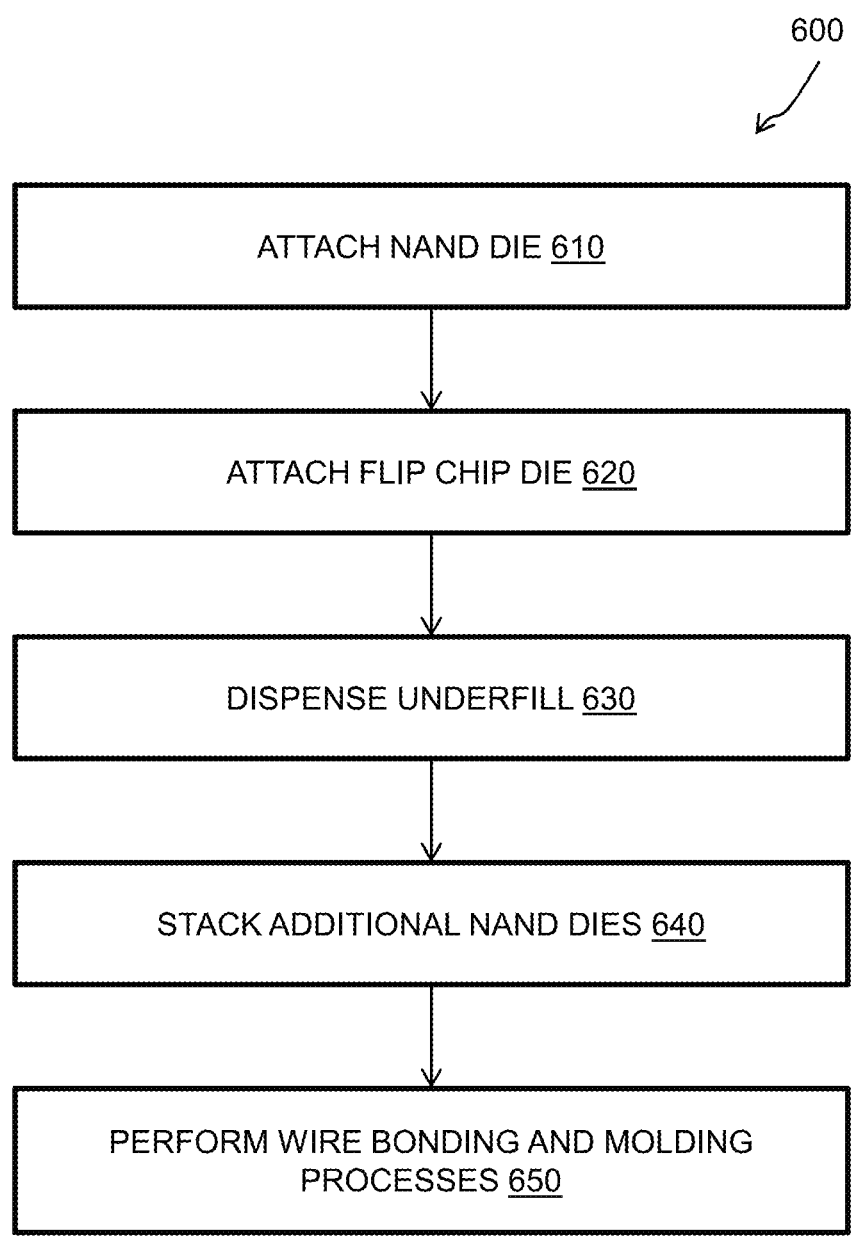
FIG. 6 is a diagram of a process flow depicting a manufacturing method according to one or more embodiments.

FIG. 6 is a diagram of a process flow 600 depicting a manufacturing method according to one or more embodiments. For ease of understanding, the process flow 600 may be described herein with respect to the package 500 of FIG. 5. The process flow 600, generally, describes controlling the flow of the UF 107 within a larger semiconductor device assembly process (e.g., building of the package 500).

The process flow 600 begins at block 610, where the bottom NAND die 110 is attached to the first major surface 103 of the substrate 102. At block 620, the FC die 104 is attached to the first major surface 103 of the substrate 102. Note that the device 105 also can be attached at this time. Also, note that these elements can be attached in any order. Further, the bottom NAND die 110 may be referred to as a second component.

At block 630, the UF 107 is dispensed to flow under and around the FC die 104. In this regard, the UF 107 flows from the dispensing side 515 to flow under and around the FC die 104 and spread to the NAND die 110, which stops or prevents the UF 107 from spreading further across the surface 103 of the substrate 102. Thus, a side of the bottom NAND die 110 acts as a border on one side of the FC die 104.

At block 640, the additional NAND dies 111 and 112 are stacked on the bottom NAND die 110. Assembly is then completed at block 650, where wire bonding and molding processes are performed. Note that a size Y of the KOZ area of the package 500 is much smaller than a size X of KOZ area of the package 301.

According to one or more embodiments, UF and mold compound are two different epoxy polymer materials. The UF used in dispensing underfill process is a smaller filler size (e.g., less than 1 um) than a compound (e.g., about 20 um) used in mold process. In next generation packages, components (e.g., capacitance or resistance) can be moved to a NAND dies below area (as there is more space due to the reduced KOZ area), and the UF can be used to fill these components to avoid solder bridge issues.

The flow charts and block diagrams in the Figures illustrate the architecture, functionality, and operation of possible implementations of packages and assembly methods according to various embodiments of the present invention. In this regard, each block in the flowcharts may represent a module, segment, or portion of instructions, which comprises one or more processes for assembling a semiconductor device. In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

Although features and elements are described above in particular combinations, one of ordinary skill in the art will appreciate that each feature or element can be used alone or in any combination with the other features and elements. For example, the NAND die stack can comprise many more than three NAND dies such that the upper dies in the stack extend over the FC die. The FC die may comprise a controller that interfaces with a host device for reading and programming the NAND dies.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof. Similarly, the words "include," "including," and "includes" mean including, but not limited to. Also, as used herein, the word "may" is used in a permissive sense (i.e., meaning having the potential to), rather than the mandatory sense (i.e., meaning must).

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to."

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

The descriptions of the various embodiments herein have been presented for purposes of illustration, but are not intended to be exhaustive or limited to the embodiments disclosed. That is, while the disclosure is susceptible to various modifications and alternative forms, specific embodiments thereof are shown by way of example in the drawings and will herein be described in detail. Many modifications and variations will be apparent to those of ordinary skill in the art without departing from the scope and spirit of the described embodiments. Thus, it should be understood, that the drawings and accompanying detailed description are not intended to limit the disclosure to the particular form illustrated, but on the contrary, the intention is to cover all modifications, equivalents and alternatives falling within the spirit and scope of the present disclosure, including those defined by the appended claims. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device package, comprising:
   a substrate;
   a first component attached to a first major surface of the substrate;
   an underfill positioned under and around the first component;
   a second component comprising a NAND die attached to the first major surface and spaced from a first side of the first component by a keep-out-zone area, wherein a side surface of the second component facing the first component provides a border to the underfill;
   the keep-out-zone area extending from the first side of first component to the side surface of the second component and free of components or printed circuit board (PCB) traces; and
   a third component attached to the first major surface of the substrate and located on the substrate in relation to a second side of the first component,
   wherein a portion of the underfill covers the keep-out-zone area and tapers from the first component towards the second component,
   wherein the underfill is not positioned between the NAND die and the substrate.

2. The package of claim 1, wherein the first component comprises a flip chip die.

3. The package of claim 1, wherein the third component comprises a dam.

4. The package of claim 1, wherein the NAND die is a bottom component of a plurality of NAND dies stacked on top of another, which form a NAND die stack.

5. The package of claim 1, wherein the keep-out-zone area is sized respective to the configuration of the second component on the substrate.

6. The package of claim 1, wherein the first side of the first component comprises a dispensing side of the first component.

7. The package of claim 1, wherein the third component provides a second border to the underfill.

8. the package of claim 1, wherein the third component comprises a NAND die.

9. The package of claim 1, wherein the third component comprises a resistor or a capacitor.

10. The package of claim 1, wherein the second component is attached to the first major surface at a location that prevents the underfill from spreading beyond the border.

11. The package of claim 1, wherein the keep-out-zone area is at least partially defined by dimensions of the underfill.

12. The package of claim 1, wherein the underfill excludes solder bridges for the first component or the second component.

13. The package of claim 1, wherein the underfill does not extend beyond the border defined by the second component.

14. The package of claim 1, wherein the side surface of the second component lies within a plane generally perpendicular to the first major surface of the substrate, and the underfill does not extend through the plane.

15. A semiconductor package comprising:
    a substrate having a first major surface;
    a flip chip die attached to the first major surface of the substrate;
    an underfill positioned under and around the flip chip die;
    a first memory die attached to the first major surface of the substrate and spaced from a first side of the flip chip die by a keep-out-zone area, wherein a side surface of the first memory die facing the flip chip die provides a border to the underfill;
    the keep-out-zone area extending from the first side of the flip chip die to the side surface of the first memory die and free of components or printed circuit board (PCB) traces;
    one or more second memory dies stacked on the first memory die; and
    a third component attached to the first major surface of the substrate and located on the substrate in relation to a second side of the flip chip die;
    wherein the border prevent flow of the underfill,
    wherein a portion of the underfill covers the keep-out-zone area and tapers from the flip chip die towards the first memory die, and
    wherein the underfill is not positioned between the first memory die and the substrate.

16. The semiconductor package of claim 15, wherein the flip chip die is electrically connected to first contacts on the substrate with solder balls, and
    wherein the first memory die and the one or more second memory dies are electrically connected to second contacts on the substrate with bond wires.

17. The semiconductor package of claim 16, wherein the third component comprises:
    a passive device,
    wherein the underfill is dispensed under the flip chip die from the first side and flows beneath the flip chip die to the second side, and wherein the underfill abuts the first side of the flip chip die.

18. The semiconductor package of claim 15, wherein the side surface of the first memory die lies within a plane generally perpendicular to the first major surface of the substrate, and the underfill does not extend through the plane.

* * * * *